United States Patent [19]
Averkiou et al.

[11] Patent Number: 5,817,541
[45] Date of Patent: Oct. 6, 1998

[54] METHODS OF FABRICATING AN HDMI DECAL CHIP SCALE PACKAGE

[75] Inventors: George Averkiou, Upland; Philip A. Trask, Laguna Hills, both of Calif.

[73] Assignee: Raytheon Company, Lexington, Mass.

[21] Appl. No.: 822,092

[22] Filed: Mar. 20, 1997

[51] Int. Cl.[6] .................................................. H01L 21/44
[52] U.S. Cl. ............................................ 438/107; 438/622
[58] Field of Search ..................................... 438/622, 623, 438/107, 110, 113

[56] References Cited

U.S. PATENT DOCUMENTS

| | | | |
|---|---|---|---|
| 5,023,205 | 6/1991 | Reche | 438/623 |
| 5,151,388 | 9/1992 | Bakhit et al. | 438/107 |
| 5,262,351 | 11/1993 | Bureau et al. | 438/107 |
| 5,514,613 | 5/1996 | Sanradkea et al. | 638/113 |
| 5,691,245 | 11/1997 | Bakhit et al. | |

*Primary Examiner*—Kevin Picardat
*Attorney, Agent, or Firm*—Leonard A. Alkov; Glenn H. Lenzen, Jr.

[57] ABSTRACT

Methods of producing a chip scale package that enables any chip with peripheral bond pads to be converted to an area array chip scale package suitable for chip on board assembly. The present invention produces the equivalent of a flip chip die when a chip supplier does not provide one. Processing is performed that provides thin film metal interconnections between the chip bond pads and area array bond pads on the bottom of the package. High reliability thin film metal interconnections are thus provided that connect the bond pads of the chip to the area array bond pads to permit external connection to the chip.

9 Claims, 4 Drawing Sheets

ULTRAVIOLET RADIATION

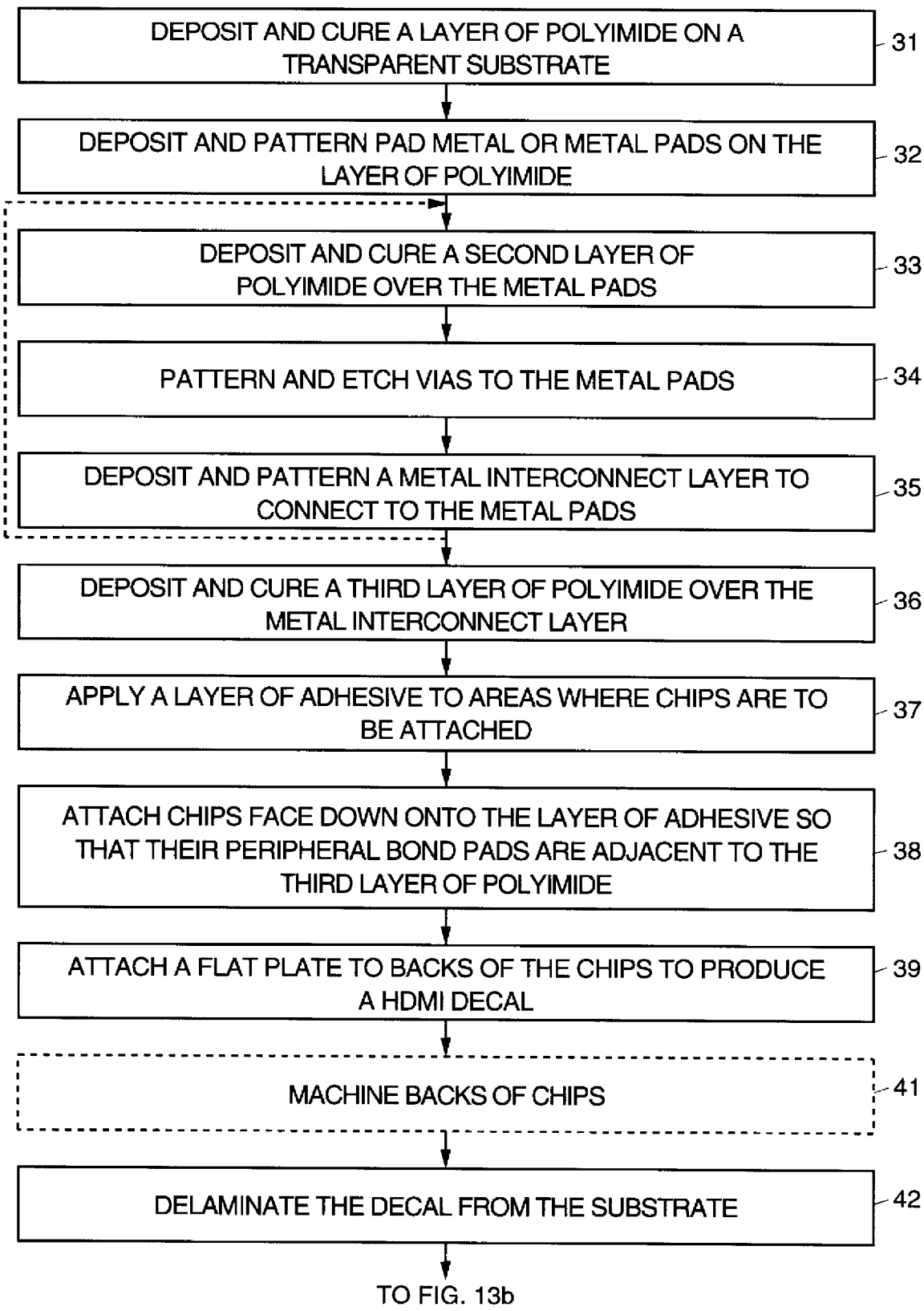

METHODS OF FABRICATING AN HDMI DECAL CHIP SCALE PACKAGE

BACKGROUND

The present invention relates generally to chip scale packages, and more particularly, to methods of fabricating a high density multichip interconnect (HDMI) decal chip scale package.

The assignee of the present invention uses chip on board assembly processes to produce high density, low cost, low weight, and high reliability electronic packages for military, automotive, commercial and space applications. It is highly desirable that small and highly reliable chip scale packages be developed for use in such military, automotive, commercial and space applications.

There are commercially available chip scale packages that use wire bonds to connect a chip to the package. These packages are relatively large and are thus less desirable, and these packages have wire bond reliability problems. Some approaches to producing the chip scale package attempt to flip chip individual die to form the package. These suffer from problems achieving reliable metallization in the pad region and tricky exposed solder tracks to the area array pads.

Therefore, it is an objective of the present invention to provide for methods of fabricating a high density multichip interconnect (HDMI) decal chip scale package.

SUMMARY OF THE INVENTION

To meet the above and other objectives, the present invention provides for processing methods for fabricating a chip scale package that enables any chip with peripheral bond pads to be converted to an area array chip scale package suitable for chip on board assembly. The present invention provides a means for producing the equivalent of a flip chip die when a chip supplier does not provide one.

A high reliability thin film metal interconnection is used to connect chip bond pads to area array bond pads. This may be accomplished using technology disclosed in U.S. patent application Ser. No. 08/738,558, filed Oct. 28, 1996, entitled "Methods of Forming Two-Sided HDMI Interconnect Structures" assigned to the assignee of the present invention as a starting point. Additional processing is performed that results in thin film interconnections between chip bond pads and contact pads on the bottom of the package.

The present invention provides the equivalent of a flip chip die when it is not available from a supplier. The present invention provides for area array contacts that can be soldered, eutectically bonded, or mounted using conductive adhesives. Chip scale packages made using the present invention have the same level of interconnects between the chip and the mounting substrate as a flip chip and is the same size as a flip chip die.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIGS. 13a and 13b show a flow diagram illustrating details of a preferred method in accordance with the present invention.

DETAILED DESCRIPTION

Figure 1:
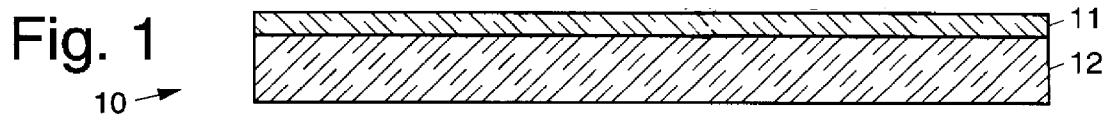
FIGS. 1–12 are cross sectional side views showing fabrication of a high density multilayer interconnect (HDMI) decal chip scale package in accordance with the principles of the present invention.

Referring to the drawing figures, FIGS. 1–12 are cross sectional side views showing complete fabrication of a high density multilayer interconnect (HDMI) decal chip scale package 10 using a processing method 30 in accordance with the principles of the present invention. The processing method 30 may be implemented in part using technology disclosed in U.S. patent application Ser. No. 08/738,558, filed Oct. 28, 1996, entitled "Methods of Forming Two-Sided HDMI Interconnect Structures" assigned to the assignee of the present invention as a starting point. Additional processing is performed that results in thin film interconnections between the chip bond pads and contact pads on the bottom of the package as will be described below. The HDMI decal chip scale package 10 is fabricated in accordance with the processing method 30 as follows.

Figure 2:
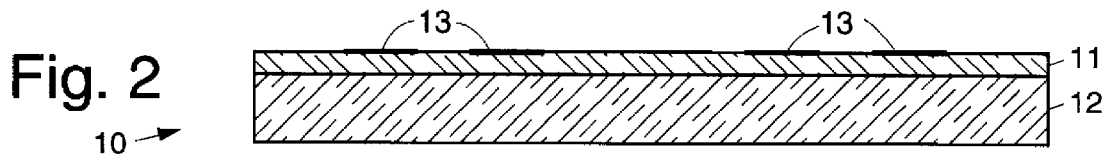
Figure 3:
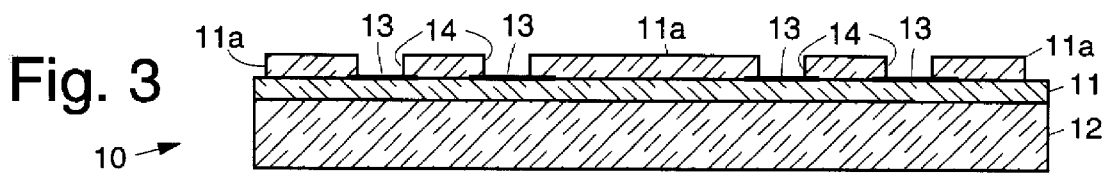
Figure 4:
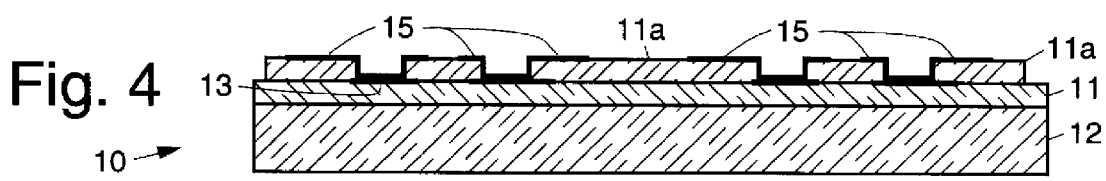
Figure 5:
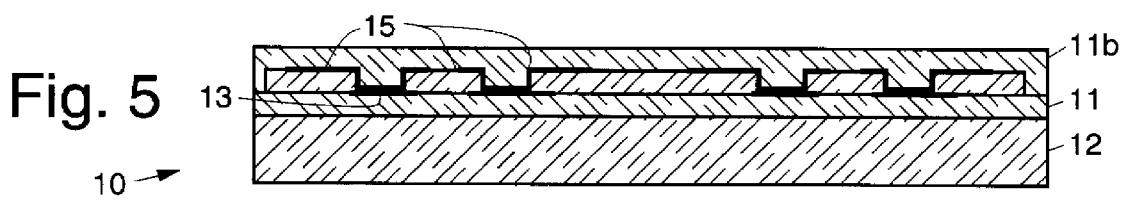

Referring to FIG. 1, a layer of polyimide 11 is deposited and cured 31 on a transparent substrate 12. Referring to FIG. 2, pad metal, such as nickel, for example, comprising metal pads 13, is deposited and patterned 32 on the layer of polyimide 11. Referring to FIG. 3, a second layer of polyimide 11a is deposited and cured 33, and vias 14 to the metal pads 13 are patterned and etched 34. Referring to FIG. 4, a metal interconnect layer 15, such as aluminum or copper, for example, is deposited and patterned 35. The metal interconnect layer 15 provides connection to the metal pads 13. Referring to FIG. 5, a third layer of polyimide 11b is deposited and cured 36.

Figure 6:
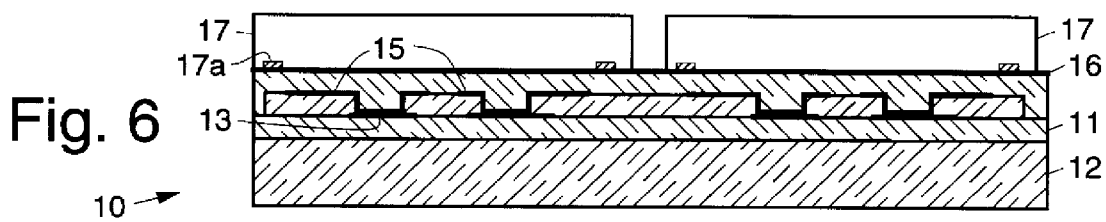

Referring to FIG. 6, a thin layer of adhesive 16 is applied 37 to areas where chips 17 are to be attached. Chips 17 are attached 38 face down onto the layer of adhesive 16 using precise die placement equipment such as is used for flip chip placement. The chips 17 are thus disposed with their peripheral bond pads 17a adhesively attached to the third layer of polyimide 11b.

Figure 7:
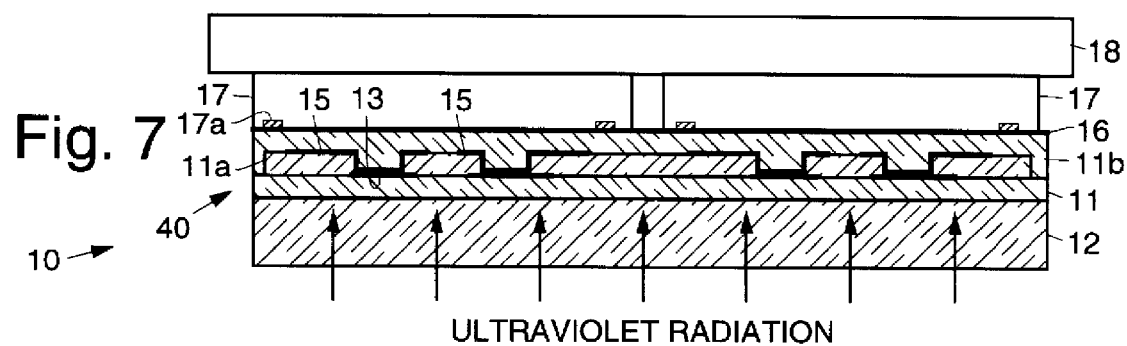

Referring to FIG. 7, a flat plate 18 is attached 39 to backs of the chips 17 using an adhesive. This produces an HDMI decal 40. If necessary, the backs of the chips 17 may be machined 41 in situ to provide a flat level surface for attachment of the flat plate 18. Ultraviolet radiation, for example, is used to irradiate the first layer of polyimide 11 through the transparent substrate 12 which delaminates 42 the HDMI decal 40, along with the chips 17 and flat plate 18 from the transparent substrate 12.

Figure 8:
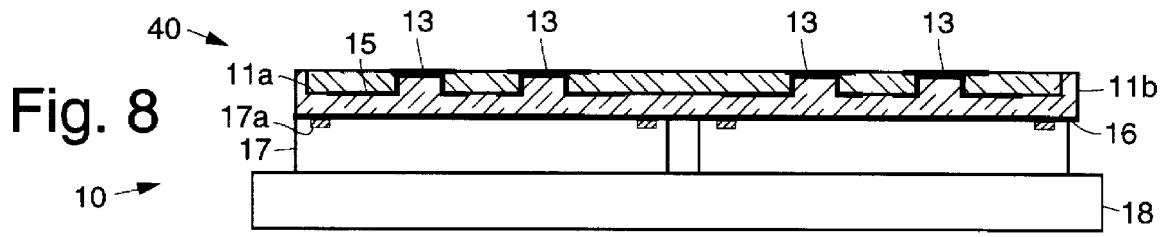
Figure 9:
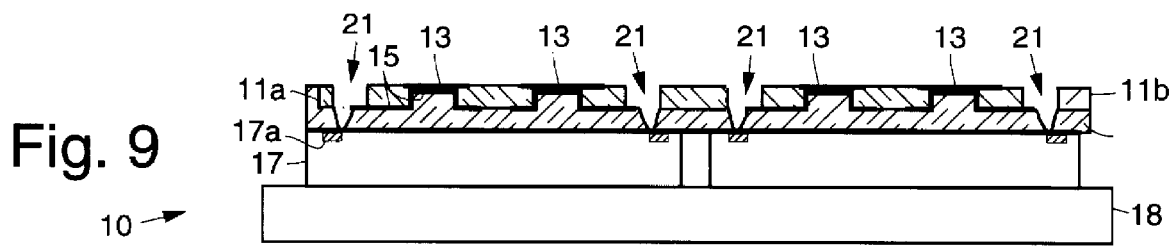
Figure 10:
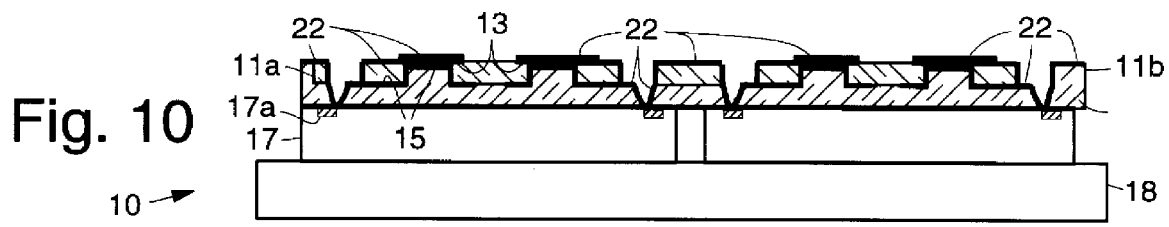

Referring to FIG. 8, it shows the HDMI decal 40 comprising the layers of polyimide 11a, 11b, metal pads 13, chips 17 and flat plate 18, after they are delaminated 42 from the transparent substrate 12. Referring to FIG. 9, vias 21 are formed 43, such as by laser ablation, for example, through the layers of polyimide 11a, 11b to expose selected metal pads 13 and portions of the metal interconnect layer 15. Referring to FIG. 10, a second metal interconnect layer 22 is deposited 44 on the exposed surface of the second and third layers of polyimide 11a, 11b.

Figure 11:
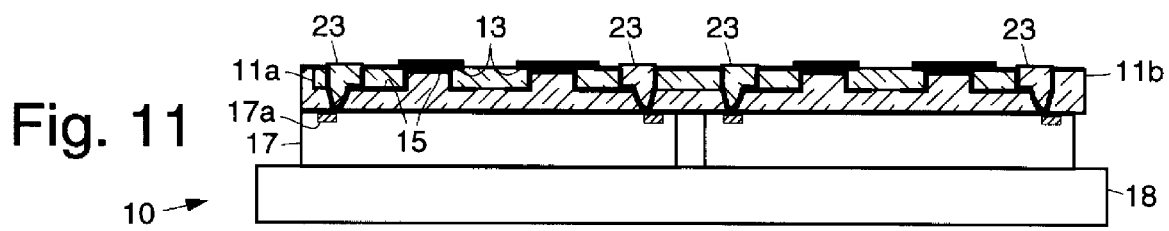

Referring to FIG. 11, a layer of dielectric material 23, such as polyimide, for example, is used as an interlayer dielectric, and is deposited 45 on the surface of the second metal interconnect layer 22 to fill depressions in the second metal interconnect layer 22 where the vias 21 were formed. The dielectric material 23 is cured 46 and used as an etch mask to protect regions where contact between the metal pads 13 and the metal interconnect layer 15 is made. The surface of the HDMI decal 40 is etched 47 through the dielectric material 23 forming the etch mask. An etchant is used that does not etch the metal pads 13.

Figure 12:
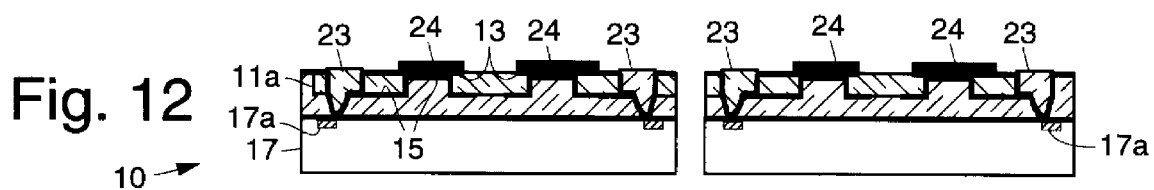

Referring to FIG. 12, the HDMI decal 40 may be tailored for assembly by depositing 48, such as by plating, for example, appropriate area array bonding pads 24 in a predetermined configuration to connect to the metal pads 13. The area array bonding pads 24 permit external connection to the chip 17. If desired, the chips 17 may be tested in panel form before removal from the flat plate 18. The chips 17 are then separated 49 from each other, such as by laser ablating the second and third layers of polyimide 11a, 11b. The separated chips 17 are then released 50 from the flat plate 18, such as by heating the flat plate 18.

Figure 13B:
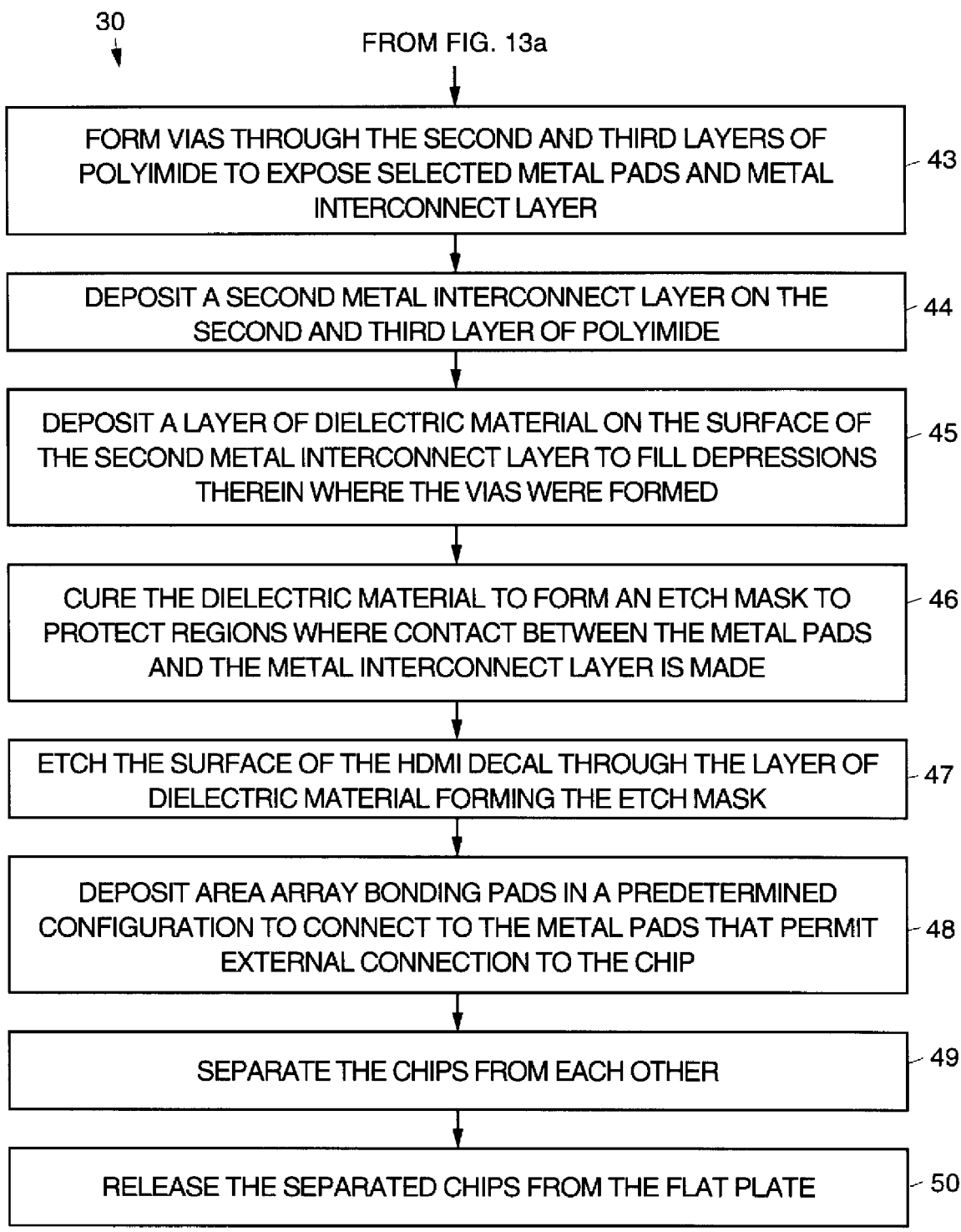

For the purposes of completeness, reference is made to FIGS. 13a and 13b which show a flow diagram illustrating details of the method 30. The method has the following steps. Step 1: deposit and cure 31 a layer of polyimide 11 on a transparent substrate 12. Step 2: deposit and pattern 32 pad metal or metal pads 13 on the layer of polyimide 11. Step 3: deposit and cure 33 a second layer of polyimide 1 la over the metal pads 13. Step 4: pattern and etch 34 vias 14 to the metal pads 13. Step 5: deposit and pattern 35 a metal interconnect layer 15 to connect to the metal pads 13. If additional interconnect routing is required, then Steps 3–5 (deposit and cure 33 another layer of polyimide, pattern and etch 34 vias 14 to previously formed metal pads 13, and deposit and pattern 35 another metal interconnect layer 15) may be performed. This is illustrated in FIG. 13a by the dashed line.

Step 6: deposit and cure 36 a third layer of polyimide 11b over the metal interconnect layer 15. Step 7: apply 37 a layer of adhesive 16 to areas where chips 17 are to be attached. Step 8: attach 38 chips 17 face down onto the layer of adhesive 16 so that their peripheral bond pads 17a are adjacent to the third layer of polyimide 11b. Step 9: attach 39 a flat plate 18 to backs of the chips 17 to produce a HDMI decal 40. Step 10: delaminate 42 the decal 40 from the substrate 12. Step 11: form 43 vias 21 through the second and third layers of polyimide 11a, 11b to expose selected metal pads 13 and metal interconnect layer 15. Step 12: deposit 44 a second metal interconnect layer 22 on the second and third layer of polyimide 11a, 11b.

Step 13: deposit 45 a layer of dielectric material 23 on the surface of the second metal interconnect layer 22 to fill depressions therein where the vias 21 were formed. Step 14: cure 46 the dielectric material 23 to form an etch mask to protect regions where contact between the metal pads 13 and the metal interconnect layer 15 is made. Step 15: etch 47 the surface of the HDMI decal 10 through the layer of dielectric material 23 forming the etch mask. Step 16: deposit 48 area array bonding pads 24 in a predetermined configuration to connect to the metal pads 13 that permit external connection to the chip 17. Step 17: separate 49 the chips 17 from each other. Step 18: release 50 the separated chips 17 from the flat plate 18.

Thus, while the above-described processing method fully details one specific embodiment of the present invention, it also encompasses more broad principles that provide the ability to fabricate a chip scale package 10 that enables any chip 17 (i.e., integrated circuit die 17) with peripheral bond pads 17a to be converted to an area array chip scale package 10 suitable for chip on board assembly. Thus, in accordance with the broad aspects of the present invention, a partial HDMI decal 40 is fabricated 31–36. The chip 17 is bonded or otherwise attached 37, 38 face down onto the partial HDMI decal 40. This structure is then inverted by delaminating 42 the partial HDMI decal 40 from its underlying substrate 12. Vias 21 are formed 43 in the partial HDMI decal 40 that expose the bond pads 17a on the chip 17. Then, thin film processing 44 is performed on the partial HDMI decal 40 to provide interconnect metal (metal interconnect layer 22) that is connected to the bond pads 17a on the chip 17. Connection areas are masked 45 and interconnect metal is removed 46 to form bonding areas. The exposed bonding areas are processed 48 to fabricate a chip scale package 10 having area array bond pads 24 that permit mounting of the chip scale package 10 in a variety of ways.

Thus, methods of fabricating a high density multichip interconnect (HDMI) decal chip scale package have been disclosed. It is to be understood that the described embodiments are merely illustrative of some of the many specific embodiments which represent applications of the principles of the present invention. Clearly, numerous and varied other arrangements may be readily devised by those skilled in the art without departing from the scope of the invention.

What is claimed is:

1. A method of fabricating a high density multilayer interconnect (HDMI) decal chip scale package, said method comprising the steps of:

depositing and curing a layer of polyimide on a transparent substrate;

depositing and patterning pad metal comprising metal pads on the layer of polyimide;

depositing and curing a second layer of polyimide over the metal pads;

patterning and etching vias to the metal pads;

depositing and patterning a metal interconnect layer that provides for connection to the metal pads;

depositing and curing a third layer of polyimide over the metal interconnect layer;

applying a layer of adhesive to areas where chips are to be attached;

attaching chips face down onto the layer of adhesive so that their peripheral bond pads are adhesively attached to the third layer of polyimide;

attaching a plate to backs of the chips to produce an HDMI decal;

delaminating the HDMI decal from the transparent substrate;

forming vias through the second and third layers of polyimide to expose selected metal pads and portions of the metal interconnect layer;

depositing a second metal interconnect layer on the exposed surface of the second and third layer of polyimide;

depositing a layer of dielectric material on the surface of the second metal interconnect layer to fill depressions therein where the vias were formed;

curing the dielectric material to form an etch mask to protect regions where contact between the metal pads and the metal interconnect layer is made;

etching the surface of the HDMI decal through the layer of dielectric material forming the etch mask;

depositing area array bonding pads in a predetermined configuration to connect to the metal pads that permit external connection to the chip;

separating the chips from each other; and releasing the separated chips from the plate.

2. The method of claim 1 wherein the step of attaching the plate to backs of the chips comprises using adhesive.

3. The method of claim 1 further comprising the step of:

machining the backs of the chips in situ to provide a flat level surface for attachment of the plate.

4. The method of claim 1 wherein the vias are formed by laser ablation through the layers of polyimide.

5. The method of claim 1 wherein the step of depositing the dielectric material comprises the step of depositing polyimide.

6. The method of claim 1 wherein the step of depositing area array bonding pads is achieved by plating the area array bonding pads.

7. The method of claim 1 wherein the step of separating the chips from each other comprises the step of laser ablating the second and third layers of polyimide.

8. The method of claim 1 wherein the step of releasing the separated chips from the plate comprises the step of heating the plate.

9. A method of fabricating a high density multilayer interconnect (HDMI) decal chip scale package, said method comprising the steps of:

fabricating an HDMI decal on a substrate;

attaching a chip having a plurality of bond pads face down onto the HDMI decal;

delaminating the HDMI decal from its underlying substrate;

forming vias in the HDMI decal that expose the bond pads on the chip;

processing the HDMI decal to provide interconnect metal that connects to the bond pads on the chip;

masking connection areas and removing portions of the interconnect metal to form bonding areas; and processing the bonding areas to provide a chip scale package having area array bond pads.

* * * * *